(12) United States Patent
Liu et al.

(10) Patent No.: US 10,836,919 B2
(45) Date of Patent: Nov. 17, 2020

(54) SOLVENT-FREE RESIN COMPOSITION AND USES OF THE SAME

(71) Applicant: TAIWAN UNION TECHNOLOGY CORPORATION, Chupei (TW)

(72) Inventors: Shur-Fen Liu, Chupei (TW); Chin-Hsien Hung, Chupei (TW)

(73) Assignee: TAIWAN UNION TECHNOLOGY CORPORATION, Chupei (TW)

( * ) Notice: Subject to any disclaimer, the term of this patent is extended or adjusted under 35 U.S.C. 154(b) by 78 days.

(21) Appl. No.: 16/249,667

(22) Filed: Jan. 16, 2019

(65) Prior Publication Data

US 2020/0115572 A1 Apr. 16, 2020

(30) Foreign Application Priority Data

Oct. 12, 2018 (TW) .............................. 107136066 A

(51) Int. Cl.
| | |
|---|---|
| *C09D 11/102* | (2014.01) |
| *C09D 11/037* | (2014.01) |
| *H05K 1/03* | (2006.01) |
| *H05K 3/00* | (2006.01) |
| *H05K 1/11* | (2006.01) |
| *H05K 3/42* | (2006.01) |

(52) U.S. Cl.
CPC .......... *C09D 11/102* (2013.01); *C09D 11/037* (2013.01); *H05K 1/0373* (2013.01); *H05K 1/115* (2013.01); *H05K 3/0044* (2013.01); *H05K 3/42* (2013.01); *H05K 2201/012* (2013.01); *H05K 2201/0959* (2013.01)

(58) Field of Classification Search
CPC .... C09D 11/102; C09D 11/037; H05K 1/115; H05K 2201/012; H05K 1/0373

USPC ........................................................... 524/80
See application file for complete search history.

(56) References Cited

U.S. PATENT DOCUMENTS

| | | | |
|---|---|---|---|
| 6,177,490 B1 | 1/2001 | Yoda et al. | |
| 6,717,071 B2 | 4/2004 | Chang et al. | |
| 7,438,969 B2 | 10/2008 | Kojima et al. | |
| 2009/0215967 A1* | 8/2009 | Lin | ................... C07F 9/657172 525/390 |

FOREIGN PATENT DOCUMENTS

| | | | |
|---|---|---|---|
| CN | 103030931 A | | 4/2013 |
| CN | 105778421 | * | 7/2016 |
| TW | 201437276 A | | 10/2014 |

OTHER PUBLICATIONS

Translation of CN105778421, Jul. 20, 2016. (Year: 2016).*
Taiwanese Search Report for Taiwanese Patent Application No. 107136066, dated Feb. 12, 2020.

* cited by examiner

*Primary Examiner* — Hui H Chin
(74) *Attorney, Agent, or Firm* — Greer, Burns & Crain, Ltd.

(57) ABSTRACT

A solvent-free resin composition is provided. The solvent-free resin composition includes:
(A) an epoxy resin component, including at least two multi-functional epoxy resins, each of which has at least three epoxy groups in a molecule;
(B) an epoxy resin hardener; and
(C) inorganic fillers, including a hollow filler and a non-hollow spherical filler, wherein the weight ratio of the hollow filler to the non-hollow spherical filler is from 1:5 to 6:1.

14 Claims, 2 Drawing Sheets

SOLVENT-FREE RESIN COMPOSITION AND USES OF THE SAME

CLAIM FOR PRIORITY

This application claims the benefit of Taiwan Patent Application No. 107136066 filed on Oct. 12, 2018, the subject matters of which are incorporated herein in their entirety by reference.

BACKGROUND

Field of the Invention

The present invention provides a solvent-free resin, especially, a solvent-free thermosetting filling resin composition comprising an epoxy resin, a hollow filler and a non-hollow spherical filler. The present invention also provides a printed circuit board with holes filled by the resin composition.

Descriptions of the Related Art

Printed circuit boards (PCBs) are substrates of electronic devices for carrying multiple electronic components that are electrically connected with each other to provide a stable circuit working environment. Due to the development of high density interconnect (HDI), both the width of PCBs' wirings and the distance between the wirings are decreased while the density of the wirings is increased. Conventional PCBs are failing to keep up with the HDI circuit design. Therefore, several new types of PCBs have been developed.

In general, PCBs are formed by alternately laminating resin dielectric layers and conductive circuit layers, wherein a plurality of holes are presented between the conductive circuit layers and the holes are plated with conductive materials to form vias and thereby provide electrical connection between the conductive circuit layers. To avoid damage to the circuit in the outer layer, even out the resin dielectric layers, and make the vias serve as the basis for the stacking hole structures of upper layers, the vias must be fully filled and polished flat. A resin composition that is used to fill the vias must have desired mechanical properties, electrical properties, and physicochemical properties.

TW 399398 discloses a filling composition, which comprises an epoxy resin which is liquid at room temperature, a phenolic resin which is liquid at room temperature, a hardening catalyst, and an inorganic filler. The composition shrinks sparingly during thermal curing and shows low hygroscopicity after thermal curing. TW 200402429 discloses a solvent-free filling material, which comprises a filler, an epoxy resin, dicyandiamide hardener, and a hardening catalyst. The filling material provides better adhesion to a conductive layer on it, thereby preventing delamination or cracking of a conductive layer, insulating layer, solder resist layer, and the like laminated on the filling material. TW 201437276 discloses a filling epoxy resin composition, which comprises an epoxy resin, imidazole compound, borate ester compound, and inorganic filler. The epoxy resin composition has good storage stability and thermal resistance and reduces the occurrence of voids and cracks during polishing. CN 103030931 discloses a thermosetting resin filling material, which comprises an epoxy resin, an epoxy resin hardener and an inorganic filler, wherein the epoxy resin hardener is selected from a group consisting of modified aliphatic polyamines and modified alicyclic polyamines. The thermosetting resin filling material has a long-term storage stability under room temperature and good filling operation performance.

Recently, with trends of high-frequency and high-speed transmission and miniaturization of electronic products, dielectric materials with low dielectric constant (Dk) and low dissipation factor (Df) have received attention in their applications for PCBs. Therefore, there is an urgent need for a thermosetting filling resin composition with low Dk.

SUMMARY

In view of the aforementioned technical problems, the present invention provides a solvent-free thermosetting filling resin composition, which can be used to fill the holes in PCBs. By means of using a hollow filler in combination with a non-hollow spherical filler, the resin composition can have excellent ability of filling (printability), and can fill the holes without generating any flaws such as bubbles, cracking or gaps. Furthermore, the dielectric material obtained by curing the resin composition has low dielectric constant (Dk), low dissipation factor (Df), and excellent wet fastness under high temperature and thermal resistance.

Therefore, an object of the present invention is to provide a solvent-free resin composition, which comprises:
(A) an epoxy resin component, comprising at least two multi-functional epoxy resins, each of which has at least three epoxy groups in a molecule;
(B) an epoxy resin hardener; and
(C) inorganic fillers, including a hollow filler and a non-hollow spherical filler, wherein the weight ratio of the hollow filler to the non-hollow spherical filler is from 1:5 to 6:1.

In some embodiments of the present invention, the epoxy resin component (A) comprises at least two multi-functional epoxy resins selected from the group consisting of phenol novolac epoxy resin, aminophenol epoxy resin, alkyl phenol novolac epoxy resin, bisphenol novolac epoxy resin, naphthalene epoxy resin, dicyclopentadiene epoxy resin, glycidyl amine epoxy resin, trihydroxyl phenylmathane epoxy resin, tetraphenolylethane epoxy resin, phthalic acid diglycidylester resin, an epoxidized product of a condensate of a phenol-based compound and an aromatic aldehyde with a phenolic hydroxyl group, and a bromide-containing epoxy resin and phosphor-containing epoxy resin thereof, triglycidyl isocyanurate, alicyclic epoxy resin, liquid alcohol ether epoxy resin, and fluorene epoxy resin.

In some embodiments of the present invention, the epoxy resin component (A) comprises phenol novolac epoxy resin and aminophenol epoxy resin, wherein the weight ratio of the phenol novolac epoxy resin to the aminophenol epoxy resin can be 1:3 to 3:1.

In some embodiments of the present invention, the epoxy resin hardener (B) is selected from the group consisting of imidazole, imidazole derivatives, salts of imidazole, salts of imidazole derivatives, and combinations thereof.

In some embodiments of the present invention, the weight ratio of the hollow filler to the non-hollow spherical filler is 1:3 to 4:1.

In some embodiments of the present invention, the hollow filler is hollow glass filler or hollow silica filler.

In some embodiments of the present invention, the non-hollow spherical filler is selected from the group consisting of crystalline silica, molten silica, barium sulfate, calcium carbonate, silicon nitride, aluminum nitride, boron nitride, aluminum oxide, magnesium oxide, aluminum hydroxide, magnesium hydroxide, titanium oxide, mica, talc, organic bentonite, kaolin, Sillitin, sintered kaolin clay, sintered talc, sintered Neuburg, and combinations thereof.

In some embodiments of the present invention, the amount of the epoxy resin hardener (B) is 1 part by weight to 20 parts by weight based on 100 parts by weight of the epoxy resin component (A).

In some embodiments of the present invention, the amount of the inorganic fillers (C) is 40 parts by weight to 200 parts by weight based on 100 parts by weight of the epoxy resin component (A).

In some embodiments of the present invention, the epoxy resin component (A) further comprises monofunctional epoxy resin, bifunctional epoxy resin, or combinations thereof.

In some embodiments of the present invention, the resin composition further comprises an additive selected from the group consisting of flame retardants, colorants, viscosity modifiers, thixotropic agents, defoaming agents, leveling agents, coupling agents, mold-release agents, surface modifying agents, plasticizers, antibacterial agents, antimould agents, stabilizers, antioxidants, phosphors, and combinations thereof.

Another objective of the present invention is to provide a printed circuit board, which has holes filled by using the aforementioned resin composition.

To render the above objectives, technical features and advantages of the present invention more apparent, the present invention will be described in detail with reference to some embodiments hereinafter.

DETAILED DESCRIPTION

Figure 1A:
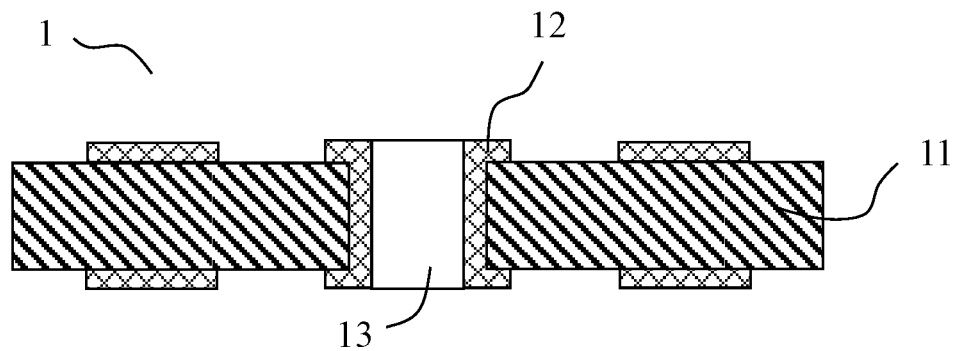
FIGS. 1a to 1c are schematic diagrams showing an embodiment of the filled printed circuit board of the present invention.

Hereinafter, some embodiments of the present invention will be described in detail. However, without departing from the spirit of the present invention, the present invention may be embodied in various embodiments and should not be limited to the embodiments described in the specification.

Unless it is additionally explained, the expressions "a," "the," or the like recited in the specification (especially in the appended claims) should include both the singular and the plural forms.

Unless it is additionally explained, while describing the constituents in the solution, mixture and composition in the specification, the amount of each constituent is calculated based on the dry weight, i.e., regardless of the weight of the solvent.

Unless it is additionally explained, the term "solvent-free" means that, based on the total weight of the resin composition, the amount of the solvent is less than 5 wt %, preferably less than 3 wt %, more preferably less than 1wt %.

In general, during thermal curing of a resin composition, the solvent in the resin composition will evaporate by heating. However, if a resin composition containing a solvent is applied to fill holes in a printed circuit board that have a high aspect ratio, the solvent will not be able to evaporate completely during the thermal curing and thus, a portion of the solvent will remain in the filled holes after the thermal curing is done. During the subsequent manufacturing processes of the printed circuit board, the remaining portion of the solvent will expand because of heat and thus forms bubbles or cracks in the filled holes. The bubbles or cracks will cause delamination and cracking of the printed circuit board and thus lower the yield. The solvent-free resin composition can effectively decrease or avoid generation of bubbles or cracks in the filled holes and thus delamination and cracking of printed circuit boards to increase yield. The technical features and effects of the present invention are described below with several embodiments.

1. SOLVENT-FREE RESIN COMPOSITION

The solvent-free resin composition of present invention comprises (A) an epoxy resin component, (B) an epoxy resin hardener, and (C) inorganic fillers. The detail descriptions for each constituents of the solvent-free resin composition are provided below.

1.1. (A) Epoxy Resin Component

The epoxy resin component (A) comprises at least two multi-functional epoxy resins with at least three epoxy groups in a molecule.

Examples of the multi-functional epoxy resin include but are not limited to the following epoxy resins having at least three epoxy groups: phenol novolac epoxy resin, aminophenol epoxy resin (especially triglycidyl aminophenol epoxy resin), alkyl phenol novolac epoxy resin, bisphenol novolac epoxy resin, naphthalene epoxy resin, dicyclopentadiene epoxy resin, glycidyl amine epoxy resin, trihydroxyl phenylmathane epoxy resin, tetraphenolylethane epoxy resin, phthalic acid diglycidylester resin, an epoxidized product of a condensate of a phenol-based compound (including biphenol, bisphenol, cresol, and the like) and an aromatic aldehyde with a phenolic hydroxyl group, and a bromide-containing epoxy resin and phosphor-containing epoxy resin thereof, triglycidyl isocyanurate, alicyclic epoxy resin, liquid alcohol ether epoxy resin, and fluorene type epoxy resin. Wherein the bisphenol novolac epoxy resin includes novolac epoxy resins with bisphenol structure, such as bisphenol A novolac type epoxy resin and bisphenol F novolac epoxy resin. In the preferred embodiment of the present invention, the epoxy resin component (A) comprises phenol novolac epoxy resin and aminophenol epoxy resin with at least three epoxy groups.

Preferably, at least one of the multi-functional epoxy resins of the epoxy resin component (A) is liquid at a temperature from 10° C. to 30° C. Therefore, in some embodiments of the present invention, the epoxy resin component (A) may have the following combinations of multi-functional epoxy resins: a combination of two multi-functional epoxy resins each of which is liquid at a temperature from 10° C. to 30° C., a combination of a multi-functional epoxy resin which is liquid at a temperature from 10° C. to 30° C. and a multi-functional epoxy resin which is solid at a temperature from 10° C. to 30° C., or a combination of two multi-functional epoxy resins each of which is solid at a temperature from 10° C. to 30° C. The epoxy resin component (A) preferably has a combination of a multi-functional epoxy resin which is liquid at a temperature from 10° C. to 30° C. and a multi-functional epoxy resin which is solid at a temperature from 10° C. to 30° C. A combination of two multi-functional epoxy resins each of which is liquid at a temperature from 10° C. to 30° C. is the most preferred.

Examples of the liquid multi-functional epoxy resins include but are not limited to the following epoxy resins with at least three epoxy groups: liquid phenol novolac epoxy resin, liquid aminophenol epoxy resin (particularly, triglycidyl aminophenol epoxy resin), liquid alkyl phenol novolac epoxy resin, liquid bisphenol novolac type epoxy resin, liquid naphthalene type epoxy resin, liquid dicyclopentadiene epoxy resin, liquid glycidyl amine epoxy resin, liquid trihydroxyl phenylmathane epoxy resin, liquid tetraphenolylethane epoxy resin, liquid phthalic acid diglycidylester resin, liquid alicyclic epoxy resin, and liquid alcohol ether epoxy resin.

In some embodiments of the present invention, the epoxy resin component (A) comprises liquid phenol novolac epoxy resin and liquid aminophenol epoxy resin with at least three epoxy groups.

Commercially available products of phenol novolac epoxy resin include but are not limited to: jER 152 and jER 154, available from Mitsubishi Chemical; DEN 431, DEN 485, and DEN 438, available from DOW CHEMICAL; and Epiclon N740 available from DIC. Examples of aminophenol epoxy resin include but are not limited to N,N,O-triglycidyl-p-aminophenol (such as jER 630 available from Mitsubishi Chemical, Sumi-Epoxy ELM-100 and ELM-120 available from Sumitomo Chemical, and Araldite MY0500 and MY0600 available from HUNTSMAN) and N,N,N',N'-tetraglycidyl diamino diphenylmathane (such as jER 604 available from Mitsubishi Chemical, Sumi-Epoxy ELM-434 available from Sumitomo Chemical, Araldite MY9634 and MY-720 available from HUNTSMAN, and Epotohto YH434 available from TOHTO Chemical Industry Co., Ltd). In some embodiments of the present invention, the epoxy resin component (A) comprises phenol novolac epoxy resin jER 152 and aminophenol epoxy resin jER 630.

In the epoxy resin component (A), the amount of each multi-functional epoxy resins can be adjusted depending on the needs. To ensure the synergistic effect of using multiple multi-functional epoxy resins, the amount of each multi-functional epoxy resins should not be too low. For example, in the case where the epoxy resin component (A) comprises phenol novolac epoxy resin and aminophenol epoxy resin, the weight ratio of the phenol novolac epoxy resin to the aminophenol epoxy resin is preferably 1:3 to 3:1, more preferably 7:13 to 7:3, such as 7:12, 7:11, 7:10, 7:9, 7:8, 1:1, 7:6, 7:5, or 7:4.

The epoxy resin component (A) may comprise, in addition to multi-functional epoxy resins, optional monofunctional epoxy resin or bifunctional epoxy resin. For example, the epoxy resin component (A) may further comprise biphenol epoxy resin and/or bisphenol epoxy resin. Examples of bisphenol epoxy resin include but are not limited to bisphenol A epoxy resin, hydrogenated bisphenol A epoxy resin, brominated bisphenol A epoxy resin, bisphenol F epoxy resin, bisphenol S epoxy resin, and bixylenol epoxy resin. In some embodiments of present invention, the epoxy resin component (A) further comprises bisphenol A epoxy resin and bisphenol F epoxy resin.

1.2. (B) Epoxy Resin Hardener

The epoxy resin hardener (B) refers to a hardener suitable for promoting the curing of the epoxy resin. The type of the epoxy resin hardener is not particularly limited and can be any known conventional compound that can be used as a hardener for the epoxy resin component (A). Examples of the epoxy resin hardener include but are not limited to imidazole, imidazole derivatives, salts of imidazole, salts of imidazole derivatives, amines, amidines, organic phosphine compounds, and anhydrides, wherein imidazole, imidazole derivatives, salts of imidazole, salts of imidazole derivatives are preferred. The epoxy resin hardeners can be used either alone or in combination of two or more.

Examples of imidazole or imidazole derivatives include but are not limited to 2-ethyl-4-methylimidazole and azine derivatives thereof, 2-undecylimidazole, 2-heptadecylimidazole, 2-phenylimidazole, azine derivatives of 2-methylimidazole, 2-phenyl-4,5-dihydroxy methyl imidazole, and 2-phenyl-4-methyl-5-hydroxy methyl imidazole. Examples of salts of imidazole or imidazole derivatives include but are not limited to isocyanurates of 2-phenylimidazole and isocyanurates of azine derivatives of 2-methylimidazole. Commercially available products include the following imidazole or imidazole derivatives available from Shikoku Chemicals Corporation: 2E4MZ-A, C11Z, C17Z, 2PZ, 2MZ-A, and 2E4MZ-A, which are imidazole or imidazole derivatives; 2MA-OK, 2MZ-OK and 2PZ-OK, which are isocyanurates of imidazole; and 2PHZ and 2P4MHZ, which are methylol esters of imidazole.

Examples of amines include but are not limited to dicyanodiamide and derivatives thereof, melamine and derivatives thereof, diaminomaleonitrile and derivatives thereof, diethylene triamine, triethylene tetramine, tetraethylene pentamine, bis(hexamethylene) triamine, triethylene glycol amine, diamino diphenyl methane, organic acid dihydrazide, and 3,9-bis(3-aminopropyl)-2,4,8,10-tetraoxaspiro[5.5]undecane. For example, the product with trade name ATU available from AJNOMOTO is an amine-based epoxy resin hardener.

Examples of amidines include but are not limited to octanoic acid salt and sulfonate salt of 1,8-diazabicyclo [5.4.0] undec-7-ene. For example, the product with trade name DBU available from SAN-APRO is an amidine-based epoxy resin hardener.

Examples of organic phosphine compounds include but are limited to triphenylphosphine, tricyclohexylphosphine, tributylphosphine, and methyl diphenyl phosphine.

Examples of anhydrides include but are not limited to tetrapropenyl succinic anhydride, methyl tetrahydro phthalic anhydride, methyl hexahydro phthalic anhydride, dodecenyl succinic anhydride, and methyl endo-methylene tetrahydro phthalic anhydride.

Among the aforementioned epoxy resin hardeners, imidazole has particularly excellent thermal resistance and chemical resistance and also has hydrophobicity so that it is effective in inhibiting moisture absorption. In addition, guanamines and its derivatives, organic acid salts and epoxy adducts, such as dicyanodiamide, melamine, acetoguanamine, benzoguanamine, 3,9-bis[2-(3,5-diamino-2,4,6-triazine)ethyl]-2,4,8,10-tetraoxaspiro[5,5]unde cane, can improve the adhesion of the dielectric material manufactured from the resin composition to a copper foil, provide anti-rusting property, and keep copper part of a printed circuit board from discoloration. In some embodiments of the present invention, 2MZ-A and 2E4MZ-A are used as the epoxy resin hardener (B).

In the resin composition of the present invention, based on 100 parts by weight of the epoxy resin component (A), the amount of the epoxy resin hardener (B) is preferably 1 to 20 parts by weight, more preferably 1 to 10 parts by weight, such as 2 parts by weight, 2.5 parts by weight, 3 parts by weight, 3.5 parts by weight, 4 parts by weight, 4.5 parts by weight, 5 parts by weight, 5.5 parts by weight, 6 parts by weight, 6.5 parts by weight, 7 parts by weight, 7.5 parts by weight, 8 parts by weight, 8.5 parts by weight, or 9 parts by weight. Without being restricted by any theories, it is believed that when the amount of the epoxy resin hardener is within the aforementioned preferred ranges, the epoxy resin hardener can effectively promote the curing of the epoxy resin without affecting the characteristics of other constituents of the resin composition.

1.3. (C) Inorganic Fillers

The resin composition of present invention involves the use of specific inorganic fillers in combination, i.e., the inorganic fillers (C) comprise a hollow filler and a non-hollow spherical filler. By means of which, the present invention can provide the effects of improving thermal conductivity, thermal expansion, and mechanical strength of the dielectric material obtained from the resin composition.

As used herein, a hollow filler can be any filler that has a cavity inside. The most common hollow fillers are made of glass or silica. Hollow fillers made of quartz, phenolic resin, carbon, or thermal plastic resin, or surface-modified hollow fillers may be used too. In some embodiments of the present invention, the hollow filler has a D50 average particle size of 1 to 500 µm, preferably 1 to 200 µm, and more preferably 10 to 100 µm. The wall thickness ranges between 0.1 to 20 µm, and the density ranges between 0.1 to 0.5 g/cm³. Examples of the hollow filler include but are not limited to the following commercial available products: Glass Bubbles K1, K15, K20, K25, K37, K46, S22, S38, S60, S60J, S6OHS, VS5500, S42XHS, iM16K, and iM30K, available from 3M Company; Sphericel® 110P8, 60P18, 34P30, 25P45, Q-CEL 5020, 5020FPS, 7014, 7040S, Ceramic Multi Cellular CMC-20, CMC-15L, and Extendospheres SG, available from Potters-Ballotini; and Throughrear1110 available from JGC C&C. The aforementioned hollow fillers can be used either alone or in combination of two or more.

The non-hollow spherical filler is not particular limited and can be any fillers commonly used in resins. In general, the non-hollow spherical filler can have an average particle size of 0.1 to 25 µm, preferably 0.1 to 10 µm. Examples of the non-hollow spherical filler include but are not limited to non-metal fillers such as crystalline silica, molten silica, barium sulfate, calcium carbonate, silicon nitride, aluminum nitride, boron nitride, aluminum oxide, magnesium oxide, aluminum hydroxide, magnesium hydroxide, titanium oxide, mica, talc, organic bentonite, kaolin, Sillitin, sintered kaolin clay, sintered talc, sintered Neuburg, and the like. The aforementioned non-hollow spherical fillers can be used either alone or in combination of two or more.

In some embodiments of the present invention, the inorganic fillers (C) include S60 and iM30k available from 3M Company as hollow fillers and SC-2500-SEJ and SC-6500-SXD available from ADMATECHS as non-hollow spherical fillers.

In the resin composition of the present invention, the weight ratio of the hollow filler to the non-hollow spherical filler is preferably 1:5 to 6:1, more preferably 1:4 to 5:1, and most preferably 1:3 to 4:1, such as 2:5, 1:2, 2:3, 1:1, or 2:1. The inventors found that when the hollow filler and the non-hollow spherical filler are used in the aforementioned preferred ratio, the resin composition has better ability of filling (printability), and the dielectric material obtained therefrom has better electrical properties and thermal resistance.

In some embodiments of the present invention, based on 100 parts by weight of the epoxy resin component (A), the amount of the inorganic fillers (C) is 40 to 200 parts by weight, preferably 45 to 180 parts by weight, and more preferably 50 to 160 parts by weight, such as 55 parts by weight, 60 parts by weight, 65 parts by weight, 70 parts by weight, 75 parts by weight, 80 parts by weight, 85 parts by weight, 90 parts by weight, 95 parts by weight, 100 parts by weight, 105 parts by weight, 110 parts by weight, 115 parts by weight, 120 parts by weight, 125 parts by weight, 130 parts by weight, 135 parts by weight, 140 parts by weight, 145 parts by weight, 150 parts by weight, or 155 parts by weight.

1.4. (D) Other Optional Additives

The resin composition of the present invention may optionally comprise other constituents, such as the additives known in the art to selectively improve the physicochemical properties of the dielectric material obtained by curing the resin composition or the processability of the resin composition during the manufacturing process of the dielectric material. Examples of the known additives include but are not limited to flame retardants, colorants, viscosity modifiers, thixotropic agents, defoaming agents (polydimethylsiloxane, modified silicon-based defoaming agents, fluorine-containing based defoaming agents, polymer-based defoaming agents, surfactants, emulsion type defoaming agents, and the like), leveling agents, coupling agents, mold-release agents, surface modifying agents, plasticizers, antibacterial agents, antimould agents, stabilizers, antioxidants, and phosphors. The aforementioned additives can be used alone or in combination of two or more. The amount of the additives can be adjusted by persons having ordinary skill in the art depending on the needs after having the disclosure of the subject specification and therefore will not be described in detail herein.

In some embodiments of the present invention, the resin composition further comprises flame retardants. Examples of flame retardants include but are not limited to phosphorus-containing flame retardants, bromine-containing flame retardants, and combinations thereof. Examples of phosphorus-containing flame retardants include metal phosphinates, phosphates, phosphazenes, poly ammonium phosphates, melamine polyphosphates, and melamine cyanurates. Examples of bromine-containing flame retardants include tetrabromobisphenol A, decabromodiphenyloxide, decabrominated diphenyl ethane, 1,2-bis(tribromophenyl)ethane, brominated epoxy oligomer, octabromotrimethylphenyl indane, bis(2,3-dibromopropyl) ether, tris(tribromophenyl) triazine, brominated aliphatic hydrocarbon, and brominated aromatic hydrocarbon.

In some embodiments of the present invention, the resin composition further comprises colorants. Colorants can be any general inks with resistance to printing. Examples of colorants include but are not limited to phthalocyanine blue, phthalocyanine green, iodine green, bis-azo yellow, crystal violet, titanium oxide, carbon black or naphthalene black.

2. PRINTED CIRCUIT BOARD

The resin composition of the present invention can be used to fill holes (e.g., vias) in printed circuit boards. Therefore, the present invention also provides a filled printed circuit board which has holes filled by using the resin composition of the present invention. The method of forming the filled printed circuit board is described below with reference to the appended figures.

Figure 1B:
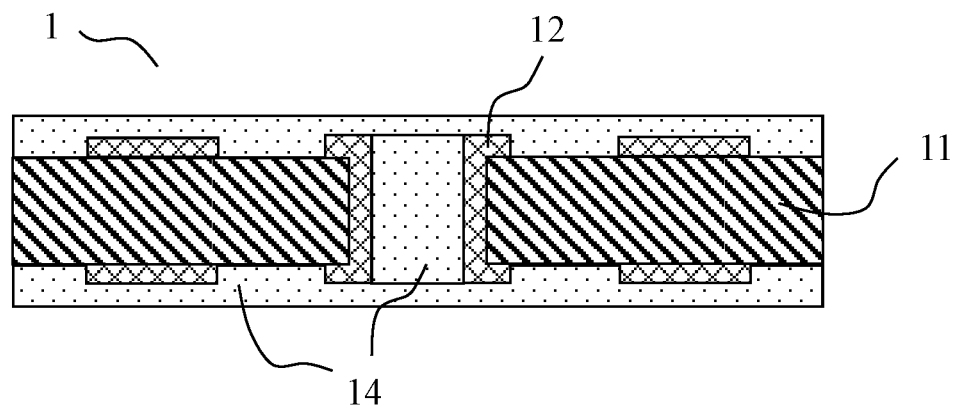
Figure 1C:
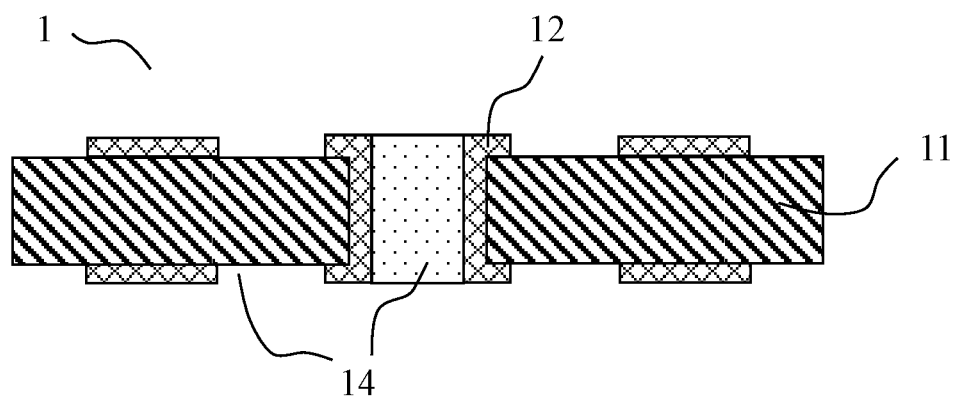

FIGS. 1a to 1c are schematic diagrams showing the manufacturing of an embodiment of the filled printed circuit board of the present invention. As shown in FIG. 1a, the printed circuit board 1 has a dielectric layer 11, a conductive circuit layer 12, and holes 13. As shown in FIG. 1b, the resin composition 14 of the present invention can be filled into the holes 13 of the printed circuit board 1 using any conventional patterning methods, and then the filled resin composition 14 is heated to a predetermined temperature for curing. Examples of conventional patterning methods include but are not limited to a screen printing method, a roller coating method, a mold coating method, and a spray coating method. The holes can be through holes or non-through holes, such as plating through holes, buried vias, blind vias, or pits between conductive circuits. After curing, the cured part that protrudes from the printed circuit board 1 is removed by grinding or polishing, thereby obtaining a flat surface as shown in FIG. 1c.

For ease of grinding or polishing, the aforementioned heating and curing of the resin composition can be performed in two stages. Specifically, the filled resin composition can be heated, for example, under 90° C. to 150° C. for 30 to 90 minutes to reach a semi-cured state. Then, after grinding or polishing is done, the semi-cured resin composition can be heated, for example, under 140° C. to 250° C. for 30 to 90 minutes to reach a completely cured state. The hardness of the semi-cured resin composition can be controlled by altering the heating temperature or heating duration.

Figure 2A:
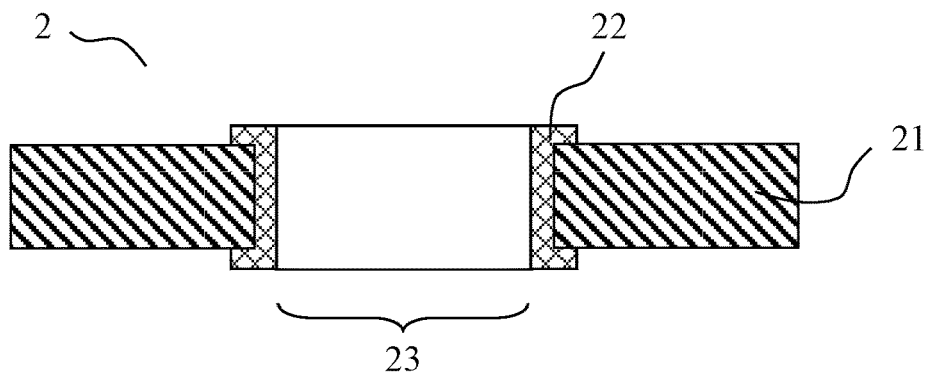
FIGS. 2a to 2c are schematic diagrams showing another embodiment of the filled printed circuit board of the present invention.
Figure 2B:
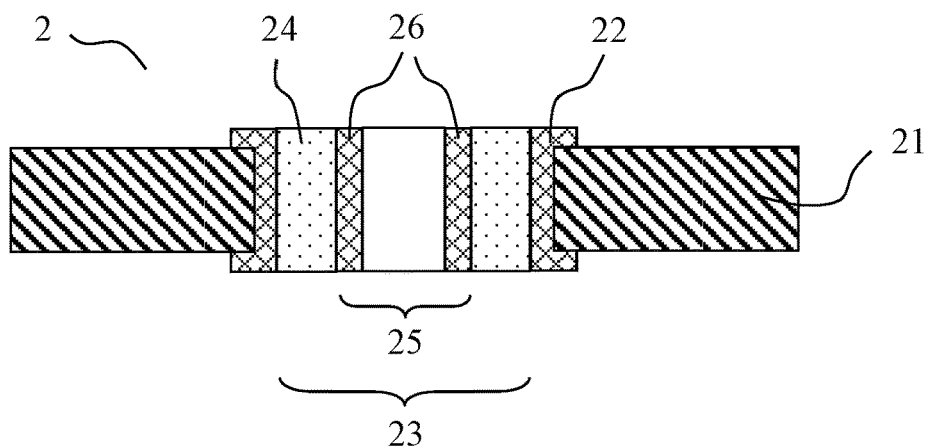
Figure 2C:
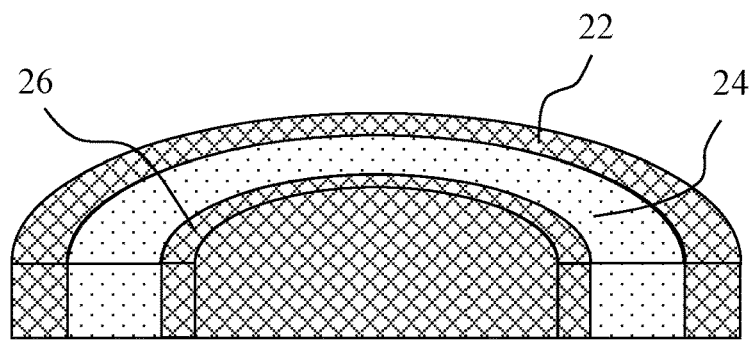

FIGS. 2a to 2c are schematic diagrams showing the manufacturing of a preferred printed circuit board. Related manufacturing method may also refer to TW 525417, the subject matters of which are incorporated herein in their entirety by reference. As shown in FIG. 2a, a printed circuit board 2 has a dielectric layer 21, a conductive circuit layer 22, and holes 23. As shown in FIG. 2b, the resin composition 24 of the present invention is filled into holes 23, and then a hole 25 with a diameter smaller than that of the hole 23 is formed in the resin composition 24. After that, the wall of the hole 25 is subjected to a metallization process to form a conductive circuit layer 26 with a smaller hole diameter. Thereby, a structure in which the resin composition 24 is positioned between the conductive circuit layers 22 and 26 is obtained, as shown in FIG. 2c.

3. EXAMPLES

The present invention will be further illustrated by the embodiments hereinafter, wherein the measuring instruments and methods are respectively as follows:

[Viscosity Test]

0.2 ml of the resin composition is used as a test sample. The test sample is tested by a cone-and-plate viscometer (trade name: TV-30, manufactured by TOKI SANGYO) under the following test conditions for the viscosity value of the resin composition: a test temperature of 25° C., test rotation speed of 5 rpm, and test time of 30 seconds.

[Ability of Filling (Printability) Test]

Glass-fiber epoxy substrates that have plating through holes formed by panel plating are prepared. The thickness of each substrate is 1.6 mm and the diameter of each plating through hole is 0.8 mm. The resin composition is filled into the plating through holes by a screen printing method. Then, the filled glass-fiber epoxy substrates are placed in a hot-air circulating type drying furnace to be subjected to a thermal curing treatment at 110° C. and 150° C. for 30 minutes and 60 minutes, respectively, thereby, obtaining evaluation samples. The samples are physically polished and ground. The polished and ground samples are placed under a 100× optical microscope to observe cross-sections of 100 filled plating through holes. The results are evaluated according to the following references. When all the plating through holes are filled completely (the number of incompletely filled through holes is less than 3), the result is recorded as "O". When only a few through holes are filled incompletely (the number of incompletely filled through holes is 4 to 9), the result is recorded as "Δ". When the resin composition leaks from the bottom of the through holes or when the through holes are filled incompletely (the number of incompletely filled through holes is 10 or more), the result is recorded as "X".

[Water Absorption Test]

The resin composition is coated onto a shiny side of a copper foil using a scraper. The shiny side of copper foil coated with the resin composition is then placed in a hot-air circulating type drying furnace to conduct a thermal curing treatment (at 110° C. for 30 minutes and then 150° C. for 60 minutes). After that, the resin composition is removed from the shiny side of copper foil to obtain a sample for evaluation, and the weight of the sample is measured, which is denoted as $W_1$. The sample is then subjected to moisture absorption test under a PCT condition (121° C., 100% R.H., 24 hr), and the weight of the sample measured again after moisture absorption, which is denoted as $W_2$. The water absorption of the resin composition is calculated according to the following equation.

$$\text{Water absorption}=[(W_2-W_1)/W_1]\times 100\%$$

[Glass Transition Temperature (Tg) Test]

The shiny side of copper foil coated with the resin composition is then placed in a hot-air circulating type drying furnace to conduct a thermal curing treatment (at 110° C. for 30 minutes and then 150° C. for 60 minutes). After that, the resin composition is removed from the shiny side of copper foil to obtain a sample for evaluation. The glass transition temperature of the sample is tested using Thermomechanical Analysis (TMA).

[Dielectric Constant (Dk) and Dissipation Factor (Df) Measurement]

The shiny side of copper foil coated with the resin composition is then placed in a hot-air circulating type drying furnace to conduct a thermal curing treatment (at 110° C. for 30 minutes and then 150° C. for 60 minutes). After that, the resin composition is removed from the shiny side of copper foil to obtain a sample for evaluation. The dielectric constant (Dk) and dissipation factor (Df) of the cured resin composition are measured according to ASTM D150 under an operating frequency of 1 GHz.

[Test of Thermal Resistance after Moisture Absorption]

Glass-fiber epoxy substrates that have plating through holes formed by panel plating are prepared. The thickness of each substrate is 1.6 mm and the diameter of each plating through hole is 0.8 mm. The resin composition is filled into the plating through holes by the screen printing method. Then, the filled glass-fiber epoxy substrates are placed in a hot-air circulating type drying furnace to be subjected to a thermal curing treatment in turn at 110° C. and 150° C. for 30 minutes and 60 minutes, respectively, thereby, obtaining samples for evaluation. The samples are subjected to moisture absorption test under PCT condition (121° C., 100% R.H., 24 hr) and physically polished and ground after the moisture absorption test. The polished and ground samples are immersed in a solder solution at 288° C. for 10 seconds for three times. Then, the samples are cooled down to room temperature. Cross-sections of 100 through holes filled with the resin composition are observed by an optical microscope, and the numbers of the through holes in which the cured resin composition has cracks are recorded. The results are evaluated according to the following references. If the number of the through holes in which the cured resin composition has cracks is less than 3, the solder thermal resistance test is recorded as "O", which means the thermal resistance of the resin composition is outstanding. If the number of through holes in which the cured resin composition has cracks ranges from 4 to 9, the solder thermal resistance test is recorded as "Δ", which means the thermal resistance of the resin composition is worse. If the number of through holes in which the cured resin composition has cracks of 10 or more, the solder thermal resistance test is recorded as "X", which means the thermal resistance of the resin composition is the worst.

3.1. Preparation of Resin Composition

The resin composition of each of Examples 1 to 11 and Comparative Examples 1 to 5 was prepared according to the composition and ratio shown in Table 1 by the following method. Wherein bisphenol A epoxy resin jER 828 (available from Mitsubishi Chemical) and bisphenol F epoxy resin KF-8100 (available from Kolon) are bifunctional epoxy resins, and phenol novolac epoxy resin jER 152 (available from Mitsubishi Chemical) and aminophenol epoxy resin jER 630 (available from Mitsubishi Chemical) are multifunctional epoxy resins which have at least three epoxy groups in each molecule.

Example 1

According to the ratio shown in Table 1, phenol novolac epoxy resin jER 152 (available from Mitsubishi Chemical), aminophenol epoxy resin jER 630 (available from Mitsubishi Chemical), epoxy resin hardener 2MZ-A (available from Shikoku Chemicals Corporation), hollow filler iM30k (available from 3M Company), non-hollow spherical filler SC-6500-SXD (available from ADMATECHS), and defoaming agent KS-66 (available from Shin-Etsu Chemical Co., Ltd) were mixed under room temperature to form a mixture. The mixture was then kneaded and dispersed in a three-roll mill machine to obtain solvent-free resin composition 1.

Example 2

The preparation procedures of resin composition 1 were repeated to prepare resin composition 2, except that the non-hollow spherical filler SC-6500-SXD was substituted by non-hollow spherical filler SC-2500-SEJ (available from ADMATECHS), as shown in Table 1.

Example 3

The preparation procedures of resin composition 1 were repeated to prepare resin composition 3, except that the amount of each of phenol novolac epoxy resin jER 152 and aminophenol epoxy resin jER 630 was adjusted, as shown in Table 1.

Example 4

The preparation procedures of resin composition 1 were repeated to prepare resin composition 4, except that the amount of each of phenol novolac epoxy resin jER 152 and aminophenol epoxy resin jER 630 was adjusted, as shown in Table 1.

Example 5

The preparation procedures of resin composition 1 were repeated to prepare resin composition 5, except that the amount of each phenol novolac epoxy resin jER 152, aminophenol epoxy resin jER 630, hollow filler iM30k, non-hollow spherical filler SC-6500-SXD was adjusted, and bisphenol A epoxy resin jER 828 (available from Mitsubishi Chemical) was further added, as shown in Table 1.

Example 6

The preparation procedures of resin composition 5 were repeated to prepare resin composition 6, except that bisphenol A epoxy resin jER 828 was substituted by bisphenol F epoxy resin KF-8100 (available from Kolon), and epoxy resin hardener 2MZ-A was substituted by epoxy resin hardener 2E4MZ-A (available from Shikoku Chemicals Corporation), as shown in Table 1.

Example 7

The preparation procedures of resin composition 1 were repeated to prepare resin composition 7, except that hollow filler iM30k was substituted by hollow filler S60 (available from 3M Company), as shown in Table 1.

Example 8

The preparation procedures of resin composition 3 were repeated to prepare resin composition 8, except that the amount of each of hollow filler iM30k and non-hollow spherical filler SC-6500-SXD was adjusted, as shown in Table 1.

Example 9

The preparation procedures of resin composition 1 were repeated to prepare resin composition 9, except that the amount of each of hollow filler iM30k and non-hollow spherical filler SC-6500-SXD was adjusted, as shown in Table 1.

Example 10

The preparation procedures of resin composition 1 were repeated to prepare resin composition 10, except that the amount of each of hollow filler iM30k and non-hollow spherical filler SC-6500-SXD was adjusted, as shown in Table 1.

Example 11

The preparation procedures of resin composition 1 were repeated to prepare resin composition 11, except that the amount of each of hollow filler iM30k and non-hollow spherical filler SC-6500-SXD was adjusted, as shown in Table 1.

Comparative Example 1

The preparation procedures of resin composition 1 were repeated to prepare comparative resin composition 1, except that phenol novolac epoxy resin jER 152 and aminophenol epoxy resin jER 630 were substituted by bisphenol A epoxy resin jER 828 and bisphenol F epoxy resin KF-8100 which do not have at least three epoxy groups in each molecule, as shown in Table 1.

Comparative Example 2

The preparation procedures of resin composition 1 were repeated to prepare comparative resin composition 2, except that phenol novolac epoxy resin jER 152 was not used, only one multi-functional epoxy resin, i.e. aminophenol epoxy resin jER 630, was used, and the amount of multi-functional epoxy resin was adjusted, as shown in Table 1.

Comparative Example 3

The preparation procedures of resin composition 1 were repeated to prepare comparative resin composition 3, except that non-hollow spherical filler SC-6500-SXD was substituted by comminuted filler 525 ARI (available from SIBELCO), as shown in Table 1.

Comparative Example 4

The preparation procedures of resin composition 1 were repeated to prepare comparative resin composition 4, except that hollow filler iM30k was not used, only non-hollow spherical filler SC-6500-SXD was used, and the amount of spherical filler SC-6500-SXD was adjusted, as shown in Table 1.

Comparative Example 5

The preparation procedures of resin composition 1 were repeated to prepare comparative resin composition 5, except that non-hollow spherical filler SC-6500-SXD was not used, only hollow filler iM30k was used, and the amount of hollow filler iM30k was adjusted, as shown in Table 1.

Comparative Example 6

The preparation procedures of resin composition 3 were repeated to prepare comparative resin composition 6, except that the amount of each of hollow filler iM30k and non-hollow spherical filler SC-6500-SXD was adjusted so that the weight ratio of the hollow filler to non-hollow spherical filler is smaller than 1:5, as shown in Table 1.

Comparative Example 7

The preparation procedures of resin composition 3 were repeated to prepare comparative resin composition 7, except that the amount of each of hollow filler iM30k and non-hollow spherical filler SC-6500-SXD was adjusted so that the weight ratio of the hollow filler to non-hollow spherical filler is greater than 6:1, and that epoxy resin hardener 2MZ-A was substituted by epoxy resin hardener 2E4MZ-A, as shown in Table 1.

TABLE 1

Composition of resin compositions of Examples 1 to 11 and Comparative Examples 1 to 7

| | | Epoxy resin (A) | | | | Hardener (B) | | Inorganic filler (C) | | | | | Defoaming Agent |
|---|---|---|---|---|---|---|---|---|---|---|---|---|---|
| Weight ratio | | a | b | c | d | e | f | g | h | i | j | k | l |
| Examples | 1 | 0 | 0 | 35 | 65 | 7 | 0 | 40 | 0 | 60 | 0 | 0 | 1 |
| | 2 | 0 | 0 | 35 | 65 | 7 | 0 | 40 | 0 | 0 | 60 | 0 | 1 |
| | 3 | 0 | 0 | 50 | 50 | 7 | 0 | 40 | 0 | 60 | 0 | 0 | 1 |
| | 4 | 0 | 0 | 70 | 30 | 7 | 0 | 40 | 0 | 60 | 0 | 0 | 1 |
| | 5 | 15 | 0 | 20 | 65 | 7 | 0 | 35 | 0 | 65 | 0 | 0 | 1 |
| | 6 | 0 | 15 | 20 | 65 | 0 | 7 | 35 | 0 | 65 | 0 | 0 | 1 |
| | 7 | 0 | 0 | 35 | 65 | 7 | 0 | 0 | 40 | 60 | 0 | 0 | 1 |
| | 8 | 0 | 0 | 50 | 50 | 7 | 0 | 20 | 0 | 30 | 0 | 0 | 1 |
| | 9 | 0 | 0 | 35 | 65 | 7 | 0 | 25 | 0 | 75 | 0 | 0 | 1 |
| | 10 | 0 | 0 | 35 | 65 | 7 | 0 | 80 | 0 | 20 | 0 | 0 | 1 |
| | 11 | 0 | 0 | 35 | 65 | 7 | 0 | 40 | 0 | 120 | 0 | 0 | 1 |
| Comparative Examples | 1 | 65 | 35 | 0 | 0 | 7 | 0 | 40 | 0 | 60 | 0 | 0 | 1 |
| | 2 | 0 | 0 | 0 | 100 | 7 | 0 | 40 | 0 | 60 | 0 | 0 | 1 |
| | 3 | 0 | 0 | 35 | 65 | 7 | 0 | 40 | 0 | 0 | 0 | 60 | 1 |
| | 4 | 0 | 0 | 35 | 65 | 7 | 0 | 0 | 0 | 100 | 0 | 0 | 1 |
| | 5 | 0 | 0 | 35 | 65 | 7 | 0 | 100 | 0 | 0 | 0 | 0 | 1 |
| | 6 | 0 | 0 | 50 | 50 | 7 | 0 | 14 | 0 | 86 | 0 | 0 | 1 |
| | 7 | 0 | 0 | 50 | 50 | 0 | 7 | 88 | 0 | 12 | 0 | 0 | 1 | a: Bisphenol A type epoxy resin jER 828, available from Mitsubishi Chemical (epoxide equivalent: 184-194 g/eq)
b: Bisphenol F type epoxy resin KF-8100, available from Kolon (epoxide equivalent: 160-180 g/eq)
c: Phenol novolac type epoxy resin jER 152, available from Mitsubishi Chemical (epoxide equivalent: 172-178 g/eq)
d: Aminophenol epoxy resin jER 630, available from Mitsubishi Chemical (epoxide equivalent: 90-105 g/eq)
e: Epoxy resin hardener 2MZ-A, available from Shikoku Chemicals Corporation
f: Epoxy resin hardener 2E4MZ-A, available from Shikoku Chemicals Corporation
g: Hollow filler iM30k, available from 3M Company (D50 average particle size: 16 μm)
h: Hollow filler S60, available from 3M Company (D50 average particle size: 30 μm)
i: Non-hollow spherical filler SC-6500-SXD, available from ADMATECHS (D50 average particle size: 2 μm)
j: Non-hollow spherical filler SC-2500-SEJ, available from ADMATECHS (D50 average particle size: 0.5 μm)
k: Comminuted filler 525 ARI, available from SIBELCO (D50 average particle size: 1.5 μm)
l: Defoaming agent KS-66, available from Shin-Etsu Chemical Co., Ltd

3.2. Test of Resin Composition

The viscosity test, ability of filling (printability) test, water absorption test, glass transition temperature (Tg) test, Dielectric constant (Dk) and dissipation factor (Df) measurement, and test of thermal resistance after moisture absorption were conducted for the resin compositions obtained by Examples 1 to 11 and Comparative Examples 1 to 7. The results are tabulated in Table 2.

TABLE 2

Test results of the resin compositions

| Values | | Viscosity (dPa · s) | Ability of filling (Printability) | Water absorption (%) | Tg (° C.) | Dk (1 GHz) | Df (1 GHz) | Thermal resistance after moisture absorption |
|---|---|---|---|---|---|---|---|---|
| Examples | 1 | 360 | ○ | 0.6 | 173 | 2.93 | 0.012 | ○ |
| | 2 | 765 | Δ | 0.65 | 170 | 2.91 | 0.013 | ○ |
| | 3 | 535 | ○ | 0.55 | 171 | 2.91 | 0.013 | ○ |
| | 4 | 795 | Δ | 0.50 | 178 | 2.92 | 0.016 | ○ |
| | 5 | 505 | ○ | 0.60 | 167 | 2.97 | 0.014 | ○ |
| | 6 | 455 | ○ | 0.60 | 165 | 3.00 | 0.015 | ○ |
| | 7 | 345 | Δ | 0.70 | 172 | 2.89 | 0.014 | ○ |
| | 8 | 405 | ○ | 0.60 | 170 | 3.02 | 0.019 | ○ |
| | 9 | 410 | ○ | 0.55 | 175 | 3.07 | 0.010 | ○ |
| | 10 | 675 | Δ | 0.6 | 172 | 2.81 | 0.015 | Δ |
| | 11 | 720 | Δ | 0.6 | 174 | 3.08 | 0.011 | ○ |
| Comparative Examples | 1 | 745 | Δ | 0.65 | 146 | 3.05 | 0.019 | X |
| | 2 | 325 | ○ | 1.6 | 170 | 3.25 | 0.023 | X |
| | 3 | 2785 | X | 0.60 | 173 | 2.95 | 0.012 | ○ |
| | 4 | 435 | ○ | 0.50 | 175 | 3.61 | 0.010 | ○ |
| | 5 | 810 | Δ | 1.2 | 172 | 2.54 | 0.021 | X |
| | 6 | 475 | ○ | 0.55 | 174 | 3.48 | 0.012 | ○ |
| | 7 | 715 | Δ | 1.0 | 171 | 2.72 | 0.017 | X |

As shown in Table 2, each of the solvent-free resin compositions of the present invention has suitable viscosity and excellent ability of filling (printability), and the holes filled therewith do not have flaws such as bubbles, cracking or gaps. The dielectric material obtained from the cured resin composition of the present invention has low Dk, low Df, excellent thermal resistance (Tg) and excellent thermal resistance after moisture absorption. By contrast, the results of Comparative Examples show the following differences. When the resin composition only contains bisphenol epoxy resin (Comparative Example 1), the thermal resistance after moisture absorption of the dielectric material obtained from the resin composition is poor. When the resin composition only contains one multi-functional epoxy resin having at least three epoxy groups (Comparative Example 2), the water absorption of the dielectric material obtained from the resin composition is high and the thermal resistance after moisture absorption of the dielectric material is poor. When the resin composition contains hollow filler and comminuted filler but does not contain non-hollow spherical filler (Comparative Example 3), the viscosity of the resin composition is high and ability of filling (printability) of the resin composition is poor. When the resin composition contains non-hollow spherical filler but does not contain hollow filler (Comparative Example 4), the Dk value of the dielectric material obtained from the resin composition is high. When the resin composition contains hollow filler but does not contain non-hollow spherical filler (Comparative Example 5), the viscosity of the resin composition is high, the water absorption of the dielectric material obtained from the resin composition is high, and the thermal resistance after moisture absorption of the dielectric material is poor. When the weight ratio of hollow filler to non-hollow spherical filler in the resin composition is smaller than 1:5 (Comparative Example 6), the Dk value of the dielectric material obtained from the resin composition is high. When the weight ratio of hollow filler to non-hollow spherical filler in the resin composition is greater than 6:1 (Comparative Example 7), the water absorption of the dielectric material obtained from the resin composition is high, and the thermal resistance after moisture absorption of the dielectric material is poor.

The above examples are used to illustrate the principle and efficacy of the present invention and show the inventive features thereof. People skilled in this field may proceed with a variety of modifications and replacements based on the disclosures and suggestions of the invention as described without departing from the principle and spirit thereof. Therefore, the scope of protection of the present invention is that as defined in the claims as appended.

BRIEF DESCRIPTION OF REFERENCE NUMERALS

1, 2: printed circuit board
11, 21: dielectric layer
12, 22, 26: conductive circuit layer
13, 23, 25: holes
14, 24: resin composition

What is claimed is:

1. A solvent-free resin composition, comprising:
   (A) an epoxy resin component, comprising at least two multi-functional epoxy resins, each of which has at least three epoxy groups in a molecule;
   (B) an epoxy resin hardener, which is selected from the group consisting of imidazole, imidazole derivatives, salts of imidazole, salts of imidazole derivatives, amidines, organic phosphine compounds, anhydrides, and combinations thereof; and
   (C) inorganic fillers, including a hollow filler and a non-hollow spherical filler, wherein the weight ratio of the hollow filler to the non-hollow spherical filler is from 1:5 to 6:1.

2. The resin composition of claim 1, wherein the epoxy resin component (A) comprises at least two multi-functional epoxy resins selected from the group consisting of phenol novolac epoxy resin, aminophenol epoxy resin, alkyl phenol novolac epoxy resin, bisphenol novolac epoxy resin, naphthalene epoxy resin, dicyclopentadiene epoxy resin, glycidyl amine epoxy resin, trihydroxyl phenylmathane epoxy resin, tetraphenolylethane epoxy resin, phthalic acid diglycidylester resin, an epoxidized product of a condensate of a phenol-based compound and an aromatic aldehyde having a phenolic hydroxyl group, a bromide-containing epoxy resin and phosphorus-containing epoxy resin of a condensate of a phenol-based compound and an aromatic aldehyde having a phenolic hydroxyl group, triglycidyl isocyanurate, alicyclic epoxy resin, liquid alcohol ether epoxy resin, and fluorene epoxy resin.

3. The resin composition of claim 2, wherein the epoxy resin component (A) comprises phenol novolac epoxy resin and aminophenol epoxy resin.

4. The resin composition of claim 3, wherein the weight ratio of the phenol novolac epoxy resin to the aminophenol epoxy resin is 1:3 to 3:1.

5. The resin composition of claim 1, wherein the epoxy resin hardener (B) is selected from the group consisting of imidazole, imidazole derivatives, salts of imidazole, salts of imidazole derivatives, and combinations thereof.

6. The resin composition of claim 1, wherein the weight ratio of the hollow filler to the non-hollow spherical filler is 1:3 to 4:1.

7. The resin composition of claim 1, wherein the hollow filler is hollow glass filler or hollow silica filler.

8. The resin composition of claim 1, wherein the non-hollow spherical filler is selected from the group consisting of crystalline silica, molten silica, barium sulfate, calcium carbonate, silicon nitride, aluminum nitride, boron nitride, aluminum oxide, magnesium oxide, aluminum hydroxide, magnesium hydroxide, titanium oxide, mica, talc, bentonite, kaolin, sintered kaolin clay, sintered talc, and combinations thereof.

9. The resin composition of claim 1, wherein the amount of the epoxy resin hardener (B) is 1 part by weight to 20 parts by weight based on 100 parts by weight of the epoxy resin component (A).

10. The resin composition of claim 1, wherein the amount of the inorganic fillers (C) is 40 parts by weight to 200 parts by weight based on 100 parts by weight of the epoxy resin component (A).

11. The resin composition of claim 1, wherein the epoxy resin component (A) further comprises monofunctional epoxy resin, bifunctional epoxy resin, or combinations thereof.

12. The resin composition of claim 1, further comprising an additive selected from the group consisting of flame retardants, colorants, viscosity modifiers, thixotropic agents, defoaming agents, leveling agents, coupling agents, mold-release agents, surface modifying agents, plasticizers, antibacterial agents, antimould agents, stabilizers, antioxidants, phosphors, and combinations thereof.

13. The resin composition of claim 12, wherein the flame retardant is selected from the group consisting of phosphorus-containing flame retardants, bromine-containing flame retardants, and combinations thereof.

14. A printed circuit board, which has holes filled by using the resin composition of claim 1.

* * * * *